United States Patent
Pohl

(10) Patent No.: US 11,320,477 B2
(45) Date of Patent: May 3, 2022

(54) METHOD AND DEVICE FOR ELECTRICAL TESTING OF AN ELECTRICAL ASSEMBLY FOR DEFECTS

(71) Applicant: ATEIP GMBH, Dresden (DE)

(72) Inventor: Ulrich Pohl, Baybay (PH)

(73) Assignee: ATEIP GMBH, Dresden (DE)

( * ) Notice: Subject to any disclaimer, the term of this patent is extended or adjusted under 35 U.S.C. 154(b) by 0 days.

(21) Appl. No.: 17/253,677

(22) PCT Filed: Jun. 14, 2019

(86) PCT No.: PCT/EP2019/065682
§ 371 (c)(1),
(2) Date: Dec. 18, 2020

(87) PCT Pub. No.: WO2019/243188
PCT Pub. Date: Dec. 26, 2019

(65) Prior Publication Data
US 2021/0181248 A1    Jun. 17, 2021

(30) Foreign Application Priority Data

Jun. 18, 2018  (DE) ..................... 10 2018 209 738.0
Oct. 11, 2018  (DE) ..................... 10 2018 217 406.7

(51) Int. Cl.
G01R 31/28        (2006.01)
(52) U.S. Cl.
CPC ..... G01R 31/2813 (2013.01); G01R 31/2806 (2013.01); G01R 31/2812 (2013.01)
(58) Field of Classification Search
CPC . H01L 22/12; G01R 31/2834; G01R 1/06772; G01R 1/07371; G01R 31/31905;
(Continued)

(56) References Cited

U.S. PATENT DOCUMENTS

| | | | | |
|---|---|---|---|---|
| 4,439,858 A | * | 3/1984 | Petersen | G01R 31/31915 714/734 |
| 5,262,716 A | * | 11/1993 | Gregory, Jr. | G01R 31/31905 324/73.1 |

(Continued)

FOREIGN PATENT DOCUMENTS

| | | |
|---|---|---|
| EP | 0171322 | 2/1986 |
| WO | WO 8402412 | 6/1984 |
| WO | WO 0042442 | 7/2000 |

OTHER PUBLICATIONS

International Search Report.
Written Opinion.

*Primary Examiner* — Vinh P Nguyen
(74) *Attorney, Agent, or Firm* — Jacobson Holman PLLC

(57) ABSTRACT

A method for electrical testing of an electrical circuit for defects, all electrical or electronic parts are measured simultaneously, so an electrical image of the electrical circuit is received by a control/evaluation unit, in which an electrical excitation signal of an electrical current or an electrical voltage is applied simultaneously by the control/evaluation unit and a plurality of driver circuits at a plurality of test points of the electrical circuit, which test points may be arranged in any way. The electrical excitation signals applied via the driver circuits differ with regard to their spectral characteristic. The electrical current flowing in the particular test point and the resultant electrical voltage are recorded synchronously with regard to a waveform in relation to an electrical ground potential, and subsequently parameters of the parts and their electrical connections are calculated by the control/evaluation unit.

13 Claims, 1 Drawing Sheet

(58) Field of Classification Search
CPC .............. G01R 1/0416; G01R 1/07314; G01R 1/07328; G01R 31/2818; G01R 31/318572; G01R 31/28; G01R 31/2805; G01R 31/2812; G01R 31/2813; G01R 31/2844; G01R 31/2887; G01R 31/31924; G01R 31/50; G01R 1/06794; G01R 31/282; G01R 31/318508; G01R 31/318533; G01R 31/318544; G01R 31/31908; G01R 31/31926; G01R 31/58; G01N 27/82; H01R 13/7031; H01R 13/71
See application file for complete search history.

(56) References Cited

U.S. PATENT DOCUMENTS

| | | | | |
|---|---|---|---|---|
| 5,724,383 | A * | 3/1998 | Gold | H04B 1/707 |
| | | | | 341/55 |
| 5,760,596 | A * | 6/1998 | Peiffer | G01R 31/50 |
| | | | | 324/715 |
| 6,124,715 | A * | 9/2000 | Chakraborty | G01R 31/2806 |
| | | | | 324/537 |
| 6,462,556 | B2 * | 10/2002 | Yamashita | G01R 1/07385 |
| | | | | 324/537 |
| 6,476,630 | B1 * | 11/2002 | Whitten | G01R 31/3167 |
| | | | | 324/762.05 |
| 6,677,744 | B1 * | 1/2004 | Long | G01R 31/2853 |
| | | | | 324/762.02 |
| 7,752,004 | B1 * | 7/2010 | Gajendran | G01R 31/318572 |
| | | | | 702/117 |
| 2006/0152232 | A1 * | 7/2006 | Shvets | G01R 31/2822 |
| | | | | 324/750.02 |
| 2008/0084225 | A1 | 4/2008 | Salehi et al. | |

* cited by examiner

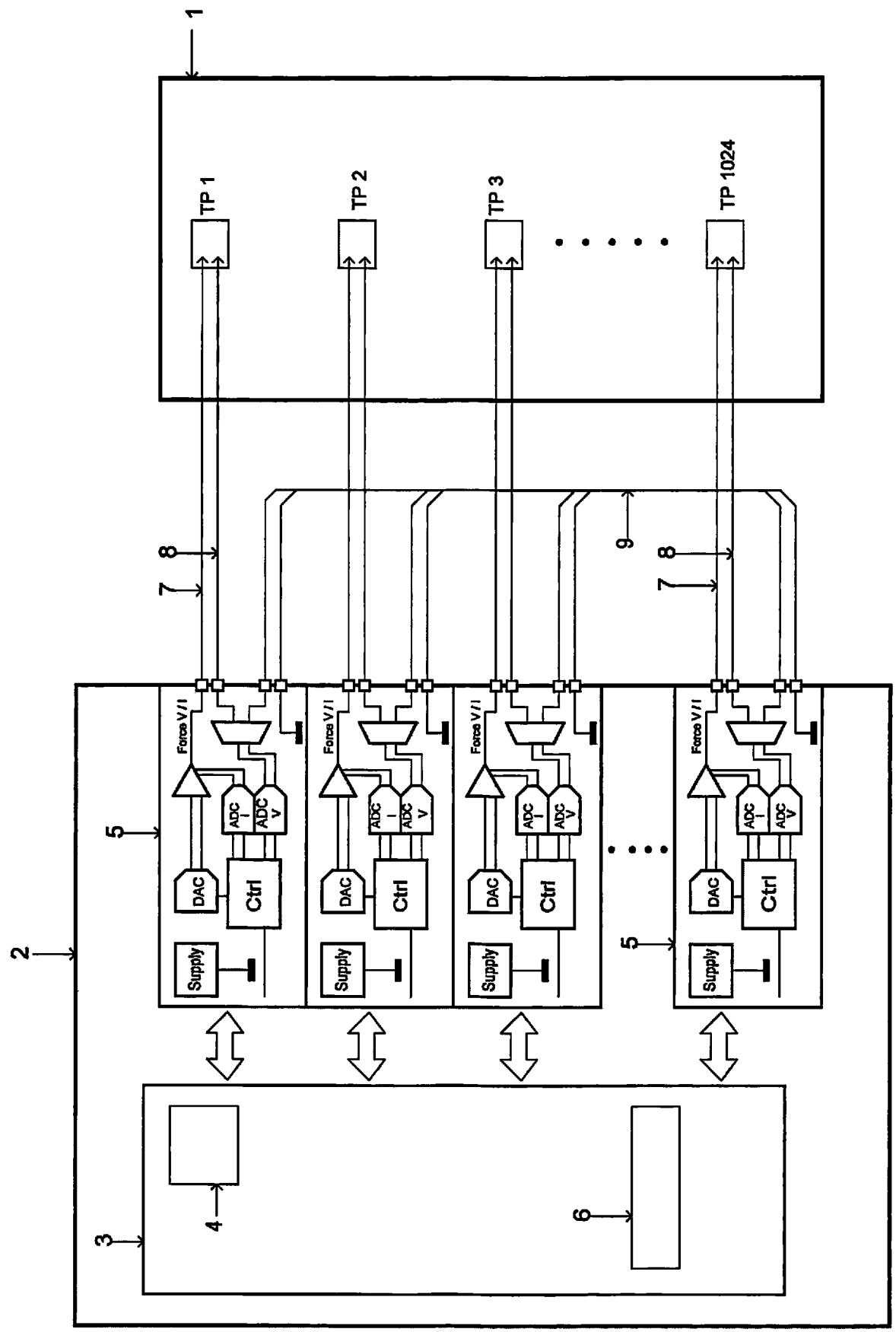

METHOD AND DEVICE FOR ELECTRICAL TESTING OF AN ELECTRICAL ASSEMBLY FOR DEFECTS

BACKGROUND OF THE INVENTION

The present invention relates to a method and a device for electrical testing of an electrical assembly or an electrical assembly element.

When producing or populating electrical assemblies, in particular circuit boards (also referred to as printed circuit boards (PCBs)), integrated circuits or electrical or electronic assembly elements, many kinds of errors may occur, for example defective parts or components, parts that have been forgotten to be mounted or have been mounted in the wrong position, and non-functioning or insufficiently functioning electrical connections. During and after the production of electrical assemblies, electrical test systems are used, amongst other things, in order to detect defects and monitor the quality of the production process and also, for example, the quality of the produced printed circuit boards.

A typical electrical test system or a typical electrical tester, respectively, generally has a "bed-of-nails" arrangement, which holds the unit to be tested, and also an automated measuring unit for carrying out the measurements. Spring-loaded measurement sensors, i.e. the "nails", are used here to contact the electrical circuit on the printed circuit board, and the unit that is to be examined may have more than a thousand of such contacted measurement points or test points, which are all electrically connected to the measuring unit.

The measuring unit in this case typically previously comprised a switching matrix and measurement apparatuses capable of measuring a number of parameters, such as electrical voltage, electrical current, electrical resistance, capacitance and inductance, and of assessing these in relation to default settings. In that method, due to the architecture of the test system used at that time, a sequential measurement of all parts or components is thus performed, with an electrical connection first being produced for each of these parts via the switching matrix, the electrical parameters being measured and compared, and the electrical connection then being separated. That method, due to its operating principle, is very time-consuming and also prone to errors due to the large number of steps to be performed and the unreliable relay matrix.

SUMMARY OF THE INVENTION

The object of the present invention is therefore to propose a method and a device with which the aforesaid disadvantages may be avoided, i.e. with which an electrical assembly may be checked quickly and reliably.

This object is achieved in accordance with the invention by a method and device according to the claims. Advantageous embodiments and refinements are described in the dependent claims.

In a method for electrical testing of an electrical assembly for defects or also for testing a printed circuit board populated with electrical or electronic components of the electrical assembly or a correspondingly populated other support for defects, all electrical or electronic parts are measured simultaneously by using a control/evaluation unit to receive an electrical image of the electrical assembly. In order to receive this electrical image, an electrical excitation signal of an electrical current or an electrical voltage is applied by the control/evaluation unit and a plurality of driver circuits simultaneously at a number of test points, i.e. at least two test points, of the printed circuit board, which may be arranged in any way, or at all measurement points. The electrical excitation signals applied via the driver circuits differ from one another with regard to their spectral characteristic; if more than two electrical excitation signals are used, these differ from one another in pairs with regard to their spectral characteristic. The electrical current flowing in the test point in question and the resultant electrical voltage in relation to an electrical ground potential are recorded synchronously with regard to a waveform, and parameters of the parts and their electrical connections are then calculated by the control/evaluation unit.

Due to the simultaneous measurement, the method may be carried out with increased efficiency, since it is now no longer necessary to use a plurality of sequentially performed measurements, but merely one parallel measurement of the assembly, i.e. in particular of a printed circuit board, an integrated circuit, or an assembly element. Since the electrical excitation signals differ in their spectral characteristic, it is possible to clearly determine the particular measurement point on the basis of the detected signal; a back calculation so to speak is performed on the basis of information, obtained at the same time, regarding the particular test point and a part associated for example with this test point. Since the test points contact an electrical network, a large amount of information may be obtained, which may be broken down, for example by appropriate filtering, on account of the well-defined, i.e. in particular distinguishable, applied excitation signals. Waveforms both of the electrical currents flowing in the various test points and also of the resultant electrical voltages in relation to an electrical ground potential are typically recorded synchronously, with the electrical image of the electrical assembly to be tested being formed by the totality of these synchronously recorded waveforms. In this case, each of the excitation signals should have a spectral characteristic clearly distinguishable from all of the others, that is to say should have a waveform distinguishable from all other excitation signals. By means of filters matched to these excitation signals, which filters for example are realized as algorithms in the control/evaluation unit, both the excitation signal or excitation signals causing this waveform as well as the type of influence of the excitation signal on the measured waveform are able to be identified for each waveform of one of the excitation signals recorded in the electrical image. The parameters of the assembly elements that are arranged from the locations of the various excitations to the location of the recorded waveform, that is to say as far as the test point, may be calculated on this basis and compared with predefined values. Both missing and defective electrical connections may thus be identified on the basis of the assembly to be tested and also deviations of the parameters of target values.

It may be provided that the electrical excitation signals differ in their signal form, i.e. that the spectral characteristic comprises the signal form as distinguishing feature. Alternatively or additionally, however, a signal length may also be used as distinguishing feature of the spectral characteristic in order to allow reliable conclusions to be drawn. Preferably, however, an amplitude of the electrical excitation signals is selected to be the same for each of these signals in order to ensure that all test points are acted on uniformly.

Typically, the calculated and/or measured parameters (i.e. in particular the electrical image) are stored in a memory unit. The memory unit may be connected here directly to the control/evaluation unit and may be integrated in a device that comprises both units, however, it may also be provided to transmit the data from the control/evaluation unit to a physically separate memory unit that is housed in a further device. The memory unit itself may generally store both the measured values and the parameters, with the parameters being typical values of the assembly elements, that is to say, for example, an electrical resistance of the assembly element in question. A direct processing of the data may also be implemented by the control/evaluation unit in real time, that is to say in particular without intermediate storage. The control/evaluation unit and the memory unit may also be connected to one another via a data transmission unit and a data receiving unit, that is to say for example via a radio connection, and may be located in different devices, that is to say physically separate from one another.

The calculated parameters or those stored in the memory unit may also be compared with predefined values by the control/evaluation unit in order to immediately determine any deviations.

The control/evaluation unit is generally a combined device, which is designed both to control and to evaluate, but may also be provided in further embodiments in the form of two units—a control unit and an evaluation unit—which then only control and only evaluate.

A device for electrical testing of an electrical assembly is provided with a control/evaluation unit that is designed to apply an electrical excitation signal of an electrical current or an electrical voltage simultaneously at a number of test points or also at all measurement points of the electrical assembly via a plurality of driver circuits. The electrical excitation signals applied via the driver circuits differ from one another in their spectral characteristic. The control/evaluation unit is also designed to measure simultaneously all electrical or electronic parts mounted on the support by receiving an electrical image of the printed circuit board and to record for each test point the electrical current flowing in the test point and the resultant electrical voltage with regard to a waveform in relation to an electrical ground potential, and to calculate parameters of the parts and their electrical connections.

It may be provided that the driver circuits are electrically insulated from one another apart from their electrical connection to the control/evaluation unit in order to minimize interfering signals. Here, precisely one individual driver circuit is typically associated with each of the test points or measurement points.

Each of the driver circuits may have two, typically exactly two, electrical signal connections for contacting an individual one of the test points. A first of the two electrical signal connections is connected here to an output of the driver circuit in question and is used to apply the electrical excitation signal to the relevant measurement point or test point, and a second of the two electrical signal connections is connected to an input of the driver circuit in question and is used to receive and forward the resultant voltage at the test point. A reliable contacting may thus be achieved for each of the test points. The two connections may be guided separately, for example each via their own needle or their own contacting element, to the relevant measurement point or test point, thus reducing interfering influences of the contacting. The two connections, however, may also optionally contact the relevant test point only in part, via a jointly used line or a jointly used needle or another contacting element.

The reference potentials of all driver circuits are typically all identical or connected to one another electrically. At least one of the driver circuits, however, may also have an electrical reference potential deviating from the rest of the driver circuits.

The entire device (or also individual parts thereof), but in particular the control/evaluation unit and the driver circuits, may be arranged combined in at least one application-specific integrated circuit (ASIC) in order to allow a compact structure. It may also be provided to arrange the control/evaluation unit and the driver circuits in a number of application-specific circuits. The described device is preferably integrated in the assembly to be tested so as to be able to achieve the most compact design possible and test the functional capability even in the case of built-in assemblies. The assembly to be tested is indeed thus of a more complex design, however the contacting and the actual testing process are facilitated. In addition, in this case the assembly may be tested at any moment in time that appears to be desirable or necessary without the use of a separate testing apparatus for this purpose. A system formed of the described device and the assembly to be tested is thus provided. It may also be provided merely to integrate individual parts of the device, in particular the driver circuits, into the module to be tested.

By means of the output unit, an output unit that is designed to output an error signal in the event that a defect is detected may be electrically connected in the device. A user may thus be made aware of an existing defect easily and quickly. The part selected as being defective is particularly preferably output on the output unit in order to enable efficient error checking. The error signal may be both visual and acoustic.

The described device may be integrated at least in part, but also fully in the electrical circuit to be tested.

A computer program product comprises a computer program (or a command sequence), comprising software means for carrying out the described method and/or for actuating the described device when the computer program is run in an automation system or in a computing unit. The computer program product may preferably be loaded directly into an internal memory or a memory unit of the computing unit or is already stored therein and typically comprises parts of a program code for carrying out the described method or for actuating the described device when the computer program product is run or executed on the computing unit. The computer program product may be stored on a machine-readable support, preferably a digital storage medium.

The described method is typically able to be carried out with the described device, i.e. the described device is designed to carry out the described method.

DESCRIPTION OF THE DRAWING

An embodiment of the invention is shown in the drawing and will be explained hereinafter on the basis of FIG. 1.

DETAILED DESCRIPTION OF THE INVENTION

FIG. 1 shows a schematic view of a printed circuit board 1 in the form an assembly to be tested and is populated with electrical and electronic parts not shown in the schematic overview or consists of such parts. The entire printed circuit board 1 inclusive of the parts arranged thereon and electrical lines connecting them is to be examined using a measuring device 2. Instead of the printed circuit board 1, any other assembly or an assembly element may also be used, on which the electrical and/or electronic parts of an electrical circuit to be tested jointly with the support are arranged. In particular, an individual microchip may include the electrical circuit.

The measuring device 2 has a control/evaluation unit 3, in which a memory unit 4 and an output unit 6, in the shown embodiment a display, are arranged.

The control/evaluation unit 3 controls a plurality of driver circuits 5 in a manner described hereinafter. In the embodiment shown in the drawing, a total of 1024 driver circuits 5 are provided, which are electrically connected to just as many test points TP on the printed circuit board 1.

Each of the test points TP arranged on the printed circuit board 1 is associated with precisely one driver circuit 5 of the measuring device 2. Each of the test points TP, which mark any points or networks of the electrical circuit on the printed circuit board 1, is connected via two signal connections 7, 8 or signal lines to the measuring device 2. Each signal connection 7 is connected to an individual output of one of the driver circuits 5, whereas each signal connection 8 is electrically connected to an input of one of the driver circuits 5. In each case one of the signals connections 7 and one of the signal connections 8 form a signal connection pair or signal line pair associated with one of the driver circuits 5. The signal connection 7 may also be referred to as a stimulus line, and the signal connection 8 as an acquisition line. In addition, all driver circuits 5 are connected in a star circuit at a common ground potential to corresponding ground connections 9 or ground lines.

Actuated by the control/evaluation unit 3, each of the driver circuits 5 supplies an excitation signal simultaneously to each test point TP via the signal connection 7. The excitation signal comprises an electrical current or an electrical voltage, wherein the excitation signals provided by the driver circuits 5 differ in pairs with regard to their spectral characteristic.

The electrical voltage resulting at the particular test point TP is measured via the signal connection 8 thereafter, but in a measurement process likewise occurring simultaneously for all signal connections 8 and test points TP, and is transmitted via the driver circuit 5 to the control/evaluation unit 3. The driver circuits 5 are of substantially identical design and are electrically insulated from one another. In addition, the signal connections 7 and 8 are also electrically insulated with respect to one another.

Due to the simultaneously received measurement values, which are transmitted from each of the test points TP to the control/evaluation unit 3, an electrical image of the printed circuit board 1 results from waveforms of the electrical voltage and the electrical current at each test point. These waveforms are caused by the excitation signals. Since each excitation signal has a signal form clearly distinguishable from all others and, at the same time, a spectral characteristic clearly distinguishable from all others, filters which are matched to the excitation signals and which are contained as an algorithm in the control/evaluation unit may be used to calculate, for each waveform recorded at the test points, those test points that have resulted in the waveform and also the extent and type of influence. It is thus possible to identify whether the electrical connections and assembly elements have the required electrical properties or whether there are deviations caused by errors. Since each of the test points has been acted on by the excitation signal clearly identifiable by the particular spectral characteristic, it is possible to conclude the particular test point by way of a post-processing of the received signals, for example by a filtering and/or a Fourier transformation. The excitation signals generally differ here in their signal forms, that is to say for example sinusoidal or square, but typically have an identical amplitude.

The control/evaluation unit 3 lastly calculates, from all measurement points of this electrical image, parameters of components of the electrical printed circuit board 1 and stores these in the memory unit 4. The calculation may be performed wholly or at least partially at the same time as the measurement process. Furthermore, reference values are already contained in the memory unit 4 and are compared with the calculated parameters of each test point TP. For example, the difference between the values may be established here, and, if a limit value of the difference is exceeded or undershot, a warning signal is output. This warning signal may also comprise only the information as to whether or not the part tested by the test part is in order. Here, in particular a defective part, a part that has been forgotten and not mounted or that has been mounted in the wrong place, and also a non-functioning or insufficiently functioning electrical connection, for example a short circuit, is considered to be a defect in the sense of the present method.

By means of the described method and the devices provided for this, the otherwise routine switching matrix may be spared in particular. Besides the advantage of a quicker measurement speed and a higher error coverage or error identification, information regarding an interaction between various measurement points or test points is also obtained by the simultaneous measurement. Since the described device may also be produced as an individual chip or ASIC or as a combination of chips, a compact design is also achieved. In addition, it is also possible to carry out a simultaneous time-resolved measurement by the driver circuits 5 and the control/evaluation unit 3.

Just some or all of the features of the various embodiments disclosed in the design examples may be combined with one another and claimed individually.

The invention claimed is:

1. A method for electrical testing of an electrical assembly for defects, comprises the steps of:
   simultaneously measuring all electrical or electronic parts mounted on a support so that,
   an electrical image of the electrical assembly is received by a control/evaluation unit;
   simultaneously applying electrical excitation signals of an electrical current or an electrical voltage by the control/evaluation unit and a plurality of driver circuits to a plurality of test points of the electrical assembly, which test points are arranged in any way on the support;
   wherein the electrical excitation signals applied via the driver circuits differ with regard to their spectral characteristic, and
   an electrical current flowing in a particular test point and the resultant electrical voltage are recorded synchronously with regard to a waveform in relation to an electrical ground potential, the electrical image of the electrical assembly is formed by the totality of these synchronously recorded waveforms, and then parameters of the electrical or electronic parts and their electrical connections are calculated by the control/evaluation unit as calculated parameters.

2. The method according to claim 1, wherein the electrical excitation signals differ in their signal form.

3. The method according to claim 1, wherein an amplitude of the electrical excitation signals is the same.

4. The method according to claim 1, wherein the calculated parameters are stored in a memory unit.

5. The method according to claim 4, wherein the stored calculated parameters are compared with predefined parameters of the electrical or electronic parts.

6. A computer program product comprising a computer program which comprises software for carrying out the method according to claim 1.

7. A device for electrically testing wherein the device comprises
- a control/evaluation unit is designed to apply electrical excitation signals of an electrical current or an electrical voltage simultaneously via a plurality of driver circuits at a plurality of test points of the electrical assembly, which test points are arranged in any way on a support of the electrical assembly, wherein
- the electrical excitation signals applied via the driver circuits differ with regard to their spectral characteristic and all electrical or electronic parts mounted on the support are measured simultaneously by recording an electrical image of a printed circuit board, the electrical image being formed by the totality of these synchronously waveforms, and
- the control/evaluation unit synchronously records, for each test point, the electrical current flowing in the test point and resultant electrical voltage with regard to a waveform in relation to an electrical ground potential and calculates parameters of the electrical or electronic parts and their electrical connections.

8. The device according to claim 7, wherein the driver circuits are electrically insulated from one another apart from their electrical connection to the control/evaluation unit.

9. The device according to claim 8, wherein an output unit is electrically connected to the control/evaluation unit and is designed to output an error signal in the event that a defect is detected and to specify a defective part.

10. The device according to claim 7, wherein each of the driver circuits has two electrical signal connections for contacting an individual one of the test points, wherein one of the two electrical signal connections is connected to an output of the particular driver circuit and the second of the two electrical signal connections is connected to an input of the particular driver circuit.

11. The device according to claim 7, wherein the control/evaluation unit and the driver circuits are arranged combined in an application-specific integrated circuit, or a plurality of application-specific integrated circuits.

12. An electrical circuit, at least partially or wholly comprising the device according to claim 7.

13. A computer program product comprising a computer program which comprises software for actuating the device according to claim 7, where the computer program is run in a the control evaluation unit.

* * * * *